United States Patent
Cooper et al.

(10) Patent No.: US 8,248,086 B2
(45) Date of Patent: Aug. 21, 2012

(54) CAPACITIVE PROXIMITY DETECTION SYSTEM FOR AN APPLIANCE

(75) Inventors: Anthony Cooper, Crestwood, KY (US);
Phillip Hombroer, Louisville, KY (US);
Joshua Kopecky, Tucson, AZ (US);
Douglas Robertson, Crestwood, KY (US); Haralabos Alexander Vassos, Bronx, NY (US)

(73) Assignee: General Electric Company, Schenectady, NY (US)

( * ) Notice: Subject to any disclaimer, the term of this patent is extended or adjusted under 35 U.S.C. 154(b) by 176 days.

(21) Appl. No.: 12/501,679

(22) Filed: Jul. 13, 2009

(65) Prior Publication Data
US 2011/0006789 A1    Jan. 13, 2011

(51) Int. Cl.
*G01R 27/26* (2006.01)
(52) U.S. Cl. .................. 324/663; 324/658; 324/600
(58) Field of Classification Search ............ None
See application file for complete search history.

(56) References Cited

U.S. PATENT DOCUMENTS

| | | | |
|---|---|---|---|
| 6,903,654 B2 | 6/2005 | Hansen et al. | |
| 6,977,588 B2 | 12/2005 | Schotz et al. | |
| 7,410,471 B1* | 8/2008 | Campbell et al. | 602/16 |
| 2007/0158359 A1 | 7/2007 | Rodrian et al. | |
| 2009/0040193 A1* | 2/2009 | Geaghan | 345/174 |
| 2009/0293733 A1* | 12/2009 | Martin et al. | 99/280 |
| 2010/0257875 A1* | 10/2010 | Kim | 62/74 |

OTHER PUBLICATIONS

Brad Stewart, "Beyond Touch Panels: Appliance Solutions Using E-Fields", Presented at the 56th Annual International Appliance Technical Conference & Exhibition, Mar. 28-30, 2005, Freescale Semiconductor, Inc., 2004, Tempe, AZ, USA.

* cited by examiner

*Primary Examiner* — Melissa Koval
*Assistant Examiner* — Trung Nguyen
(74) *Attorney, Agent, or Firm* — Global Patent Operation; Douglas D. Zhang

(57) ABSTRACT

A proximity detection system for an appliance is disclosed. The system includes an electrically conductive sensor for a capacitive proximity detection system, the sensor forming a part of an accessory device for the appliance; and an electrically conductive member disposed substantially opposite a location of the sensor and electrically connected to a ground potential to form a ground shield for the sensor.

20 Claims, 3 Drawing Sheets

CAPACITIVE PROXIMITY DETECTION SYSTEM FOR AN APPLIANCE

BACKGROUND OF THE INVENTION

The present invention relates generally to proximity detection systems, and more particularly to a capacitive proximity detection system for an appliance such as a refrigerator.

Capacitive proximity sensors and systems rely on electrostatic fields that are disturbed. When an object passes the sensing face of the capacitive proximity sensor, the electric field is disturbed and provides an output signal. Physical contact with the object is not required and any type of object can be detected, without regard to material or conductivity.

Although devices employing capacitive proximity sensors are known, the application of capacitive proximity sensors in refrigerators is problematic because the refrigerator is typically a large, grounded metal object. The large size of refrigerators, and the corresponding ground plane affects capacitive proximity detection since the ground plane absorbs the electrostatic field. This diminishes the range of proximity detection systems in refrigerators. It would be advantageous to be able to reduce the influence of the ground plane of a refrigerator in a proximity detection system for an appliance. It would also be advantageous to enhance the range of proximity sensing in a refrigerator.

BRIEF DESCRIPTION OF THE INVENTION

As described herein, the exemplary embodiments overcome one or more of the above or other disadvantages known in the art.

One aspect of the exemplary embodiments relates to a proximity detection system for an appliance. The system includes an electrically conductive sensor for a capacitive proximity detection system, the sensor being a part of an accessory device for the appliance; and an electrically conductive member disposed substantially behind and opposite a location of the sensor and electrically connected to a ground potential to form a ground shield for the sensor.

Another aspect of the exemplary embodiments relates to an appliance. The appliance includes a chassis; a capacitive proximity detection system supported by the chassis, the capacitive proximity detection system comprising an electrode for generating a electrostatic field; and an electrically conductive member supported by the chassis and disposed substantially opposite from a location of the electrode, the electrically conductive member being electrically connected to a ground potential to form a ground shield for the electrode.

Still another aspect of the exemplary embodiments relates to a refrigerator. The refrigerator includes a chassis; an accessory device supported by the chassis, the accessory device comprises an electrically conductive part which forms an electrode of a capacitive proximity detection system for generating a electrostatic field; and an electrically conductive member supported by the chassis and at least partially surrounding the electrode, the electrically conductive member being electrically connected to a ground potential to form a ground shield for the electrode.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and unless otherwise indicated, are merely intended to conceptually illustrate the structures and procedures described herein. In addition, any suitable size, shape or type of elements or materials could be used.

DETAILED DESCRIPTION OF THE EXEMPLARY EMBODIMENTS OF THE INVENTION

Figure 1:
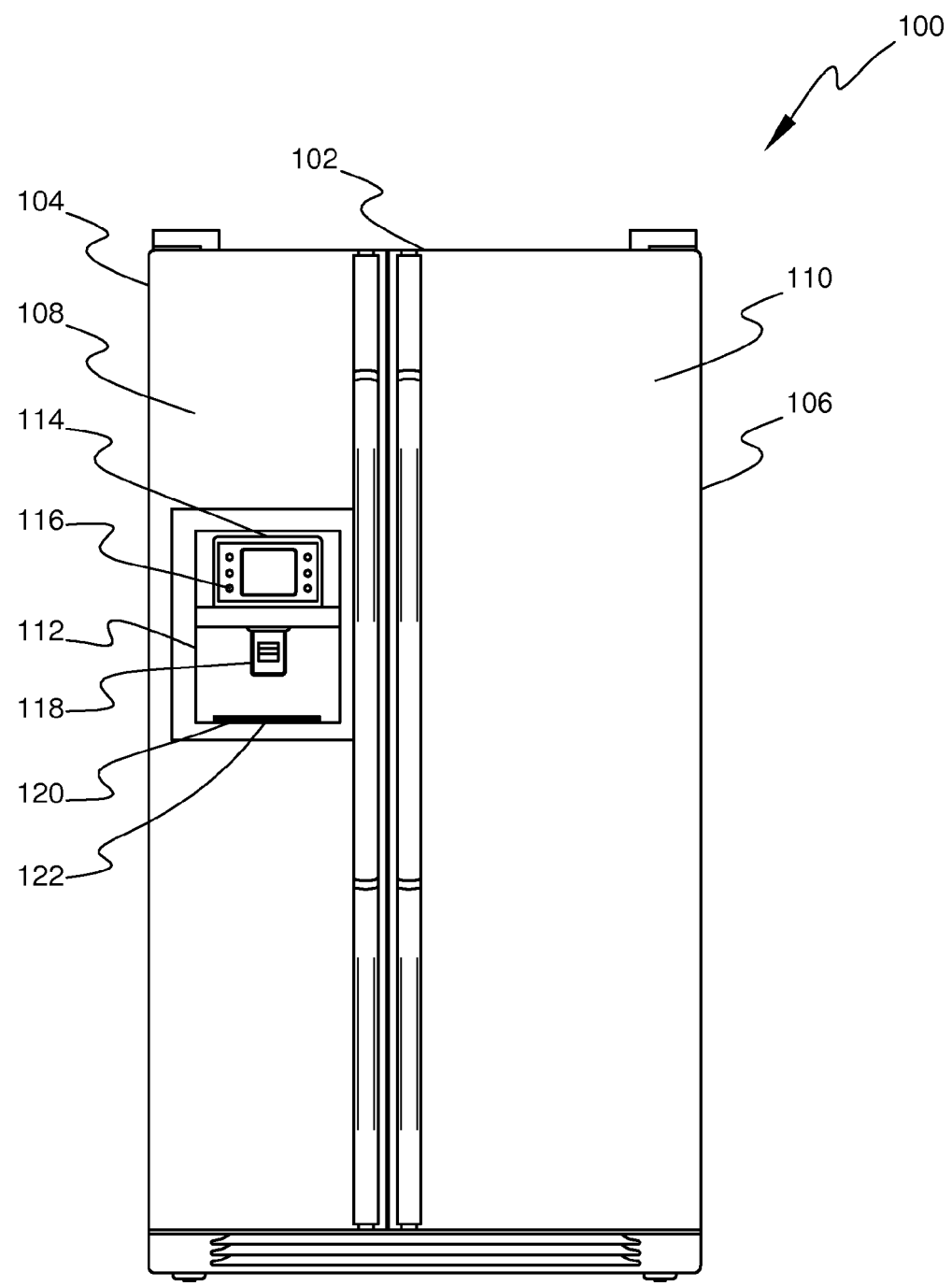
FIG. 1 is a schematic illustration of an exemplary appliance incorporating features of an exemplary embodiment.

Referring to FIG. 1, one embodiment of an appliance 100 incorporating a proximity detection system of the present invention is illustrated. In the exemplary embodiments described herein, the appliance 100 will be referred to as a refrigerator. However, the aspects of the disclosed embodiments are not so limited, and the appliance 100 can include any suitable appliance that incorporates range and proximity detection functions and devices, such as for example a range, a washer/dryer or other similar appliance.

The aspects of the disclosed embodiments address the need for short-range proximity detection capability (approximately 1 foot) for the appliance 100. Capacitive proximity detection depends on electrostatic fields that are disturbed for sensing. When the appliance 100 has a large electrically conducting chassis or body 102, capacitive proximity detection can be negatively affected. The aspects of the disclosed embodiments utilize an electrically conductive portion of the appliance 100 as the capacitive sensor for the capacitive proximity detection system and a ground shield behind the electrically conductive portion to minimize the influence of appliance body 102 on the capacitive sensor and therefore extend the range of proximity sensing.

As shown in FIG. 1, the appliance 100 has the chassis or body 102 that includes a left door 104, right door 106, each having a front surface 108 and 110, respectively. In alternate embodiments, the appliance 100 can have a single door, or more than two doors. In one embodiment the chassis 102 is formed from an electrically conductive material, such as for example, stainless steel. In alternate embodiments, the chassis 102 of the appliance 100 can be formed from any suitable material.

In one embodiment, an accessory device 112 is shown mounted in one of the doors, in this example, door 104. As shown in FIG. 1, the accessory device 112 can be integral to the front surface 108 of door 104. In alternate embodiments, the accessory device 112 can be located in any suitable area of the appliance 100. In the example shown in FIG. 1, the accessory device 112 includes a water and/or ice dispenser for a refrigerator. For descriptive purposes, the aspects of the disclosed embodiments will be described with reference to a water dispenser for a refrigerator. In alternate embodiments, the accessory device 112 can include any suitable accessory for an appliance, other than including a water dispenser. For example, the accessory device 112 could comprise an interactive display or control panel for the refrigerator.

As shown in FIG. 1, the water dispenser 112 includes one or more components, such as for example control panel 114 and buttons or keys 116. The dispenser 112 also includes a cup switch 118, a cup recess 120 and a drip tray 122. In alternate embodiments, the water dispenser 112 can include any number of components related to the operation of the dispenser 112 and/or refrigerator 100.

Figure 2:
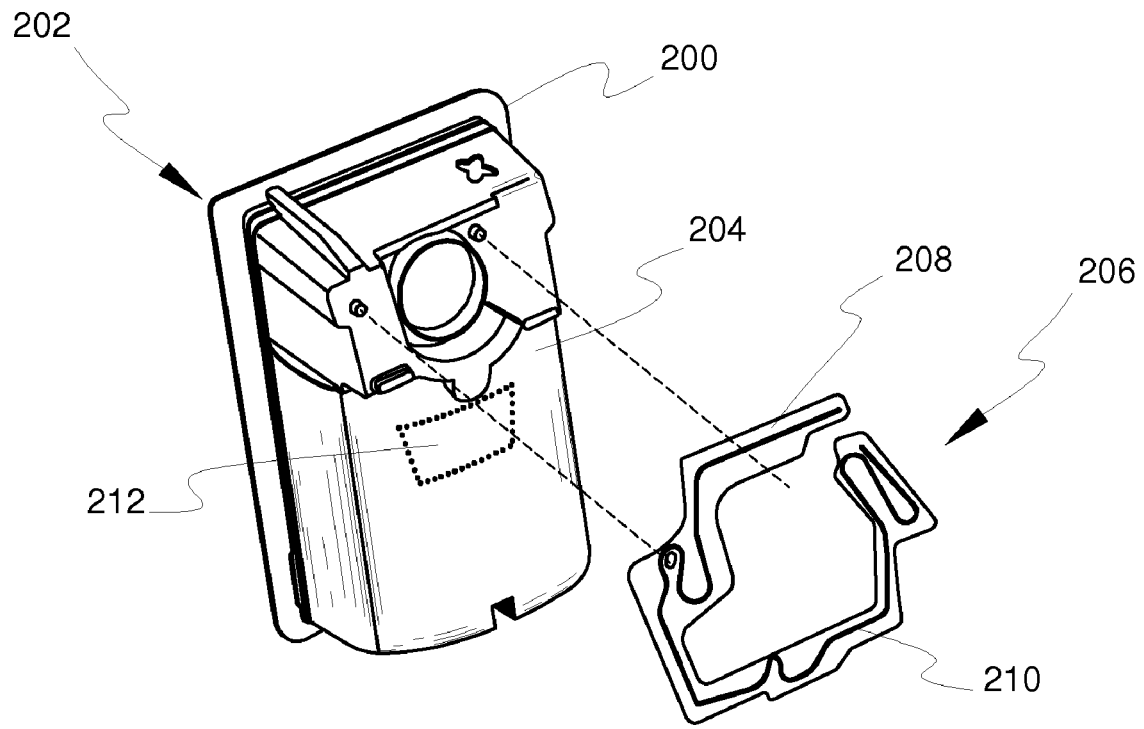
FIG. 2 is a schematic illustration of accessory housing for an appliance incorporating features of an exemplary embodiment.

Referring to FIG. 2, a rear view of a housing or frame 200 for the exemplary water dispenser 112 of FIG. 1 is illustrated. The housing 200 is usually made of electrically insulating material. When installed in an appliance, such as the refrigerator 100 of FIG. 1, generally only the front or forward facing portion 202 of the housing 200 is visible to the user. The rear, or inward facing portion 204 of the housing 200 is maintained in a suitable enclosure or recess in the door 104 of FIG. 1. More specifically, the rear portion 204 of the housing 200 will be covered from view by interior components of the refrigerator 100.

As shown in FIG. 2, in one embodiment, an electrically conductive member 206, such as for example, a foil heater, is affixed to the rear portion 204 of the housing 200. For exemplary purposes, the electrically conductive member 206 will be referred to as a foil heater, or sweat foil heater. In alternate embodiments, any suitable electrically conductive member can be used, such as for example, thin sheets of flexible foil.

The general functions of the foil heater 206 with respect to the housing 200 are not described herein, and do not limit the scope of the disclosed embodiments. The foil heater 206 generally includes a foil portion 208 and wire elements 210. In alternate embodiments, the foil heater 206 includes other suitable parts or components.

The foil heater 206 is configured to be fastened or secured to the rear portion 204 of the housing 200. The foil heater 206 can be affixed in any suitable manner, including for example, using an adhesive. In alternate embodiments, any suitable mechanism can be used, other than including an adhesive.

In order to provide the proximity detection described herein, the appliance 100 of FIG. 1 also includes a capacitive proximity detection system. The capacitive proximity detection system depends on electrostatic fields that are disturbed and generally comprises an electrically conductive sensor area and an electrical ground plane that forms a capacitor having a capacitance that varies as a result of proximity. A refrigerator is a large, grounded metal object, and will affect capacitive proximity detection. The aspects of the disclosed embodiments create a ground shield behind the dispenser 112 that surrounds the area of the sensor and that is not electrically connected to the ground plane of the refrigerator body. This greatly extends the range of proximity sensing and minimizes the influence of the refrigerator body, the grounded metal object, on the sensor. Positioning the ground shield behind the dispenser also expands the possibilities for the type of electrode that could be used to create the electrostatic field. In the embodiments disclosed herein, an electrically conductive component of the dispenser 112, such as a plated cup-switch 118, can be used as the electrode or sensor.

Figure 3:
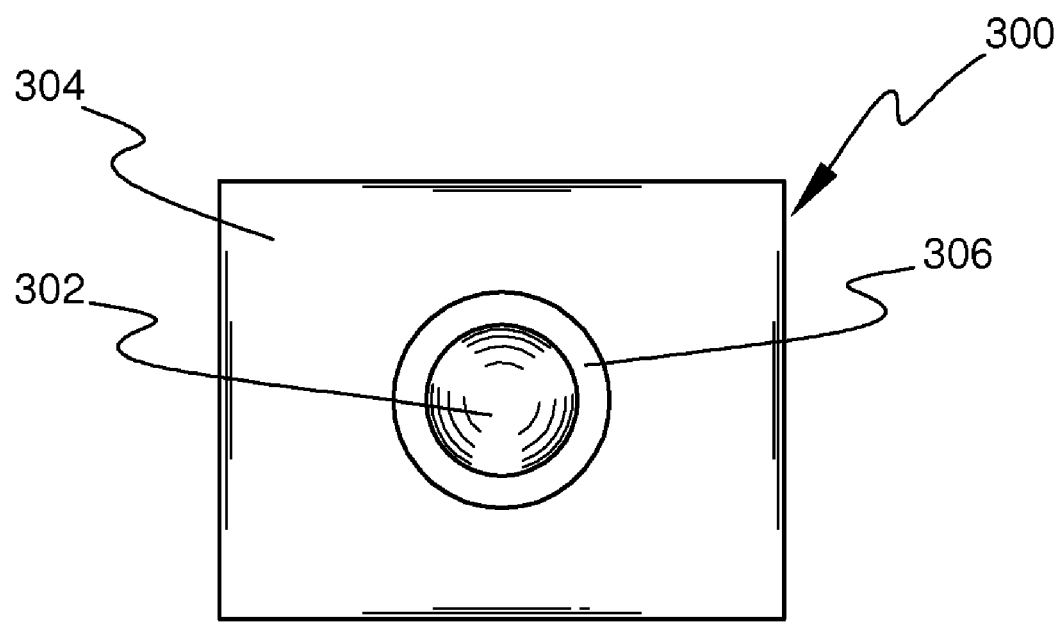
FIG. 3 is a schematic illustration of a capacitive proximity detection system incorporating features of an exemplary embodiment.

A schematic diagram of an exemplary capacitive proximity system 300 is shown in FIG. 3. As shown in FIG. 3, the capacitive proximity detection system 300 generally includes an electrode or sensor 302 and a ground shield 304. The electrode 302 and the ground shield 304 are separated by a dielectric layer, which in one embodiment comprises air. The capacitive proximity detection system 300 will include other components related to the detection of a disturbance in an electrostatic field, as well as the processing of that information and the generation of an input signal, that are not necessary to the understanding of the invention. These other components are known in the art, and therefore are not described herein.

On or more of the components of the accessory device 112 can include electrically conductive and non-conductive (non-metal and metallized components). The components can include an electrically conducting frame or structure, or an electrically conductive coating. One of the electrically conductive components of the accessory device 112 is configured to be the electrode 302 in the capacitive proximity detection system. The aspects of the disclosed embodiments utilize one of the electrically conductive components of the accessory device 112 of FIG. 1 as the electrode 302 of FIG. 3 for the capacitive proximity detection system 300. The foil portion 208 of the foil heater 206 of FIG. 2, or other similar electrically conductive member, which is behind or on the back of the housing 200, is used as the ground shield 304 of FIG. 3.

For example, in one embodiment, where the accessory device 112 is a water dispenser, the cup switch 118 is configured to be the electrode 302. In this example, the cup switch 118, or a portion thereof, is plated with an electrically conductive material. The electrically conductive portion of the cup switch 118 is electrically connected to a capacitive proximity detection circuit (not shown) in a suitable manner.

If the housing 200 of the water dispenser is electrically conductive, for purposes of the embodiments described herein, the housing 200 is electrically isolated from the chassis 102 of the appliance 100 shown in FIG. 1 in any suitable manner. In one embodiment (not shown) a non-conductive material or an insulator is configured between the housing 200 and the chassis 102 of FIG. 1. By electrically isolating the housing 200 from the chassis 102, the amount of the electrostatic field generated by the electrode 302 of FIG. 3 that would be shorted to the ground of the chassis 102 is minimized. In such configuration, there is probably no need to use the foil portion 208 of the foil heater 206 as the ground shield 304 for the electrode 302.

In the embodiments disclosed herein, the foil portion 208 of the foil heater 206 shown in FIG. 2 is electrically connected to a ground potential, but is electrically isolated from the appliance's chassis 102. The ground shield 304 absorbs the electrostatic field that is generated by the electrode 302. Interruptions in the electrostatic field, such as by a body passing in front of or near the electrode 302 will be detected, and provide a corresponding input to the capacitive proximity detection system. For example, when the refrigerator 100 of FIG. 1 includes a display unit or control panel 114, the control panel 14 can be configured to activate as the user approaches the refrigerator.

In the embodiments disclosed herein, the ground shield 304 is positioned substantially behind, or opposite the sensing face of, the sensor 302. As shown in FIG. 2, the foil heater 206 is positioned on the rear 204 of the water dispenser 200 so that the foil heater 206 is substantially opposite an area 212 occupied by the electrically conductive element acting as the electrode 302 of FIG. 3. In the example described herein, the cup switch 118 is used as the electrode 302. Thus, the foil heater 206 is positioned so that the foil portion 208 of the foil heater 206 generally occupies the area 212, which is substantially behind the cup switch 118 of FIG. 1.

Thus, while there have been shown and described and pointed out fundamental novel features of the invention as applied to the exemplary embodiments thereof, it will be understood that various omissions and substitutions and changes in the form and details of devices illustrated, and in their operation, may be made by those skilled in the art without departing from the spirit of the invention. For example, in some instances, the appliance chassis 102 or the combination of the appliance chassis 102 and the foil heater 26 can be used as a shield for the sensor, depending on the desired sensing distance. Moreover, it is expressly intended that all combinations of those elements and/or method steps that perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A proximity detection system for an appliance having an electrically conductive body, comprising:
   an electrically conductive sensor for a capacitive proximity detection system, the sensor being a part of a first accessory device for the appliance, the first accessory device comprising a housing coupling the first accessory device to the electrically conductive body of the appliance, the housing being electrically insulated from the electrically conductive body of the appliance; and
   an electrically conductive member, the electrically conductive member being part of a second accessory device for the appliance, the electrically conductive member being disposed substantially opposite a location of the electrically conductive sensor of the first accessory device and electrically connected to a ground potential to form a ground shield for the sensor.

2. The system of claim 1, wherein the electrically conductive member of the second accessory device is a foil sheet.

3. The system of claim 2, wherein the foil sheet comprises a foil portion of a foil heater of the appliance.

4. The system of claim 1, wherein the electrically conductive member is another part of the first accessory device.

5. The system of claim 1, wherein the first accessory device comprises a water dispenser, the sensor being one of an electrically conductive cup switch, an electrically conductive cup recess and an electrically conductive drip tray of the water dispenser.

6. The system of claim 1, wherein the first accessory device comprises a control panel, the sensor being an electrically conductive button of the control panel.

7. The system of claim 1 wherein the appliance is a refrigerator.

8. The proximity detection system of claim 1, wherein the second accessory device is coupled to the electrically insulating housing of the first accessory device.

9. An appliance comprising:
   an electrically conductive chassis;
   a first accessory device; and
   a second accessory device;
   a housing for the first accessory device that is electrically insulated from the chassis and couples the first accessory device to the chassis;
   a capacitive proximity detection system supported by the first accessory device, the capacitive proximity detection system comprising an electrode for generating an electrostatic field; and
   an electrically conductive member supported by the second accessory device and disposed substantially opposite from a location of the electrode of the first accessory device, the electrically conductive member being electrically connected to a ground potential to form a ground shield for the electrode of the first accessory device.

10. The appliance of claim 9, wherein the electrically conductive member is a foil heater.

11. The appliance of claim 9, wherein the electrode is an electrically conductive component of the first accessory device.

12. The appliance of claim 11, wherein the first accessory device comprises a water dispenser, the electrode being one of a cup switch, a drip tray and a cup recess of the water dispenser.

13. The appliance of claim 11, wherein the first accessory device comprises a control panel, the electrode being a button of the control panel.

14. The appliance of claim 9, wherein the appliance is a refrigerator.

15. The appliance of claim 9, wherein the electrode of the first accessory device is disposed on a front of the appliance and the electrically conductive member of the second accessory device is on a rear of the first accessory device, away from the front of the appliance.

16. A refrigerator comprising:
   an electrically conductive chassis;
   a first accessory device supported by the chassis, the first accessory device comprising an electrically conductive part which forms an electrode of a capacitive proximity detection system for generating an electrostatic field;
   a housing for mounting the first accessory to the chassis, the housing being electrically insulated from the chassis;
   a second accessory device, an electrically conductive member supported by the second accessory device and at least partially surrounding the electrode, the electrically conductive member being electrically connected to a ground potential to form a ground shield for the electrode.

17. The refrigerator of claim 16, the second accessory device comprising a foil heater, the electrically conductive member being a foil portion of the foil heater.

18. The refrigerator of claim 16, wherein the first accessory device comprises at least one of a dispenser and a control panel.

19. The refrigerator of claim 18, wherein the dispenser comprises at least one of a water dispenser and an ice dispenser.

20. The refrigerator of claim 19, wherein the electrically conductive member comprises a dispensing switch, a surface of the dispensing switch being electrically conducting.

* * * * *